(12) United States Patent
Ko

(10) Patent No.: US 11,732,861 B2
(45) Date of Patent: Aug. 22, 2023

(54) LIGHTING DEVICE

(71) Applicant: LG INNOTEK CO., LTD., Seoul (KR)

(72) Inventor: Kwang Hyun Ko, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/617,045

(22) PCT Filed: Jun. 10, 2020

(86) PCT No.: PCT/KR2020/007502
§ 371 (c)(1),
(2) Date: Dec. 7, 2021

(87) PCT Pub. No.: WO2020/256335
PCT Pub. Date: Dec. 24, 2020

(65) Prior Publication Data
US 2022/0333758 A1    Oct. 20, 2022

(30) Foreign Application Priority Data

Jun. 17, 2019  (KR) .......................... 10-2019-0071623

(51) Int. Cl.
*F21V 19/00* (2006.01)
*F21Y 115/10* (2016.01)
(Continued)

(52) U.S. Cl.
CPC ............ *F21S 43/195* (2018.01); *F21S 43/14* (2018.01); *F21V 19/003* (2013.01); *F21V 19/004* (2013.01); *F21Y 2115/10* (2016.08)

(58) Field of Classification Search
CPC .............................. F21V 19/003; F21V 19/004
See application file for complete search history.

(56) References Cited

U.S. PATENT DOCUMENTS 6,998,650 B1 * 2/2006 Wu ........................ H01L 33/483
                                                361/783
8,259,460 B2   9/2012 Bhattacharya et al.
(Continued)

FOREIGN PATENT DOCUMENTS

JP    2009-540559    11/2009
KR    20-0400571     11/2005
(Continued)

OTHER PUBLICATIONS

International Search Report dated Sep. 17, 2020 issued in Application No. PCT/KR2020/007502.
(Continued)

*Primary Examiner* — Eric T Eide
(74) *Attorney, Agent, or Firm* — Ked & Associates, LLP

(57) ABSTRACT

An embodiment relates to a lighting device. An embodiment may comprise a lighting device comprising: a light emitting module comprising a circuit board and a plurality of light emitting devices arranged on the circuit board; and a coupling member coupled to the lower surface of the circuit board, wherein the coupling member comprises: a head portion arranged on the lower surface of the circuit board and comprising a first side, a second side opposite the first side, a third side connected to the first side and the second side, and a fourth side opposite the third side; a first support portion extending from one end portion of the head portion in the vertical direction; a second support portion extending from the other end portion of the head portion in the vertical direction; a first elastic portion bent from the first support portion in an outward direction from the first support portion; a second elastic portion bent from the second support portion in an outward direction from the second support portion; a first detachment preventing portion extending from an end of the first elastic portion toward the first support portion; a second detachment preventing portion
(Continued)

extending from an end of the second elastic portion toward the second support portion; a first leg portion extending from an end of the first detachment preventing portion toward the lower surface of the circuit board; and a second leg portion extending from an end of the second detachment preventing portion toward the lower surface of the circuit board, wherein the first leg portion has a plurality of first elastic pieces, the second leg portion has a plurality of second elastic pieces, the first elastic pieces of the first leg portion are inclined outwards from the first leg portion, and the second elastic pieces of the second leg portion are inclined outwards from the second leg portion.

20 Claims, 9 Drawing Sheets

(51) Int. Cl.
*F21S 43/19* (2018.01)
*F21S 43/14* (2018.01)

(56) References Cited

U.S. PATENT DOCUMENTS

| | | | |
|---|---|---|---|
| 10,378,735 B1* | 8/2019 | Patel | F21V 19/004 |
| 2004/0094817 A1 | 5/2004 | Masashi et al. | |
| 2016/0195249 A1* | 7/2016 | Liao | F21V 17/10 29/592 |
| 2018/0135838 A1* | 5/2018 | Collins | F21V 19/003 |
| 2021/0278063 A1* | 9/2021 | Lee | F21S 4/28 |

FOREIGN PATENT DOCUMENTS

| | | |
|---|---|---|
| KR | 10-2009-0003437 | 1/2009 |
| KR | 10-2014-0099072 | 8/2014 |
| KR | 10-2018-0028684 | 3/2018 |

OTHER PUBLICATIONS

European Search Report dated Jun. 19, 2023 issued in Application No. 20827856.4.

* cited by examiner

LIGHTING DEVICE

CROSS-REFERENCE TO RELATED PATENT APPLICATIONS

This application is a U.S. National Stage Application under 35 U.S.C. § 371 of PCT Application No. PCT/KR2020/007502, filed Jun. 10, 2020, which claims priority to Korean Patent Application No. 10-2019-0071623, filed Jun. 17, 2019, whose entire disclosures are hereby incorporated by reference.

TECHNICAL FIELD

An embodiment of the invention relates to a lighting device capable of effectively combining a bracket and a light emitting module providing a surface light source.

BACKGROUND ART

Typical lighting applications include vehicle lights as well as backlights for displays and signage.

A light emitting device, for example, a light emitting diode (LED), has advantages such as low power consumption, semi-permanent lifespan, fast response speed, safety, and environmental friendliness compared to conventional light sources such as fluorescent lamps and incandescent lamps. Such light emitting diodes are being applied to various lighting devices such as various display devices, indoor lights or outdoor lights.

In recent years, lamps employing light emitting diodes have been proposed as vehicle lighting. Compared with an incandescent lamp, a light emitting diode is advantageous in that power consumption is small. Vehicle lighting uses a light emitting module including a light emitting diode disposed on a substrate in combination with a bracket, and conventionally, a bracket and a light emitting module are combined by a method such as a hook or rivet type. In this conventional method, the light emitting surface of the light emitting module was covered, the process was complicated, and the light emitting module is separated from the bracket by an external force.

DISCLOSURE

Technical Problem

A lighting device according to the embodiment may combine the light emitting module and the bracket by a simple process.

An embodiment may improve a coupling force of a light emitting module a bracket.

A lighting device according to the embodiment may improve a heat dissipation capability of a circuit board, thereby improving a reliability of the light emitting module.

Technical Solution

An embodiment of an embodiments includes a light emitting module including a circuit board and a plurality of light emitting devices disposed on the circuit board; and a coupling member coupled to a lower surface of the circuit board, wherein the coupling member includes a heat portion which is disposed on the lower surface of the circuit board and includes a first side, a second side opposite to the first side, a third side connected to the first side and the second side, and a fourth side opposite to the third side; a first support portion extending in a vertical direction from one end of the head portion; a second support portion extending in the vertical direction from the other end of the head portion; a first elastic portion bent from the first support portion in an outward direction of the first support portion; a second elastic portion bent from the second support portion in an outward direction of the second support portion; a first detachment preventing portion extending from an end of the first elastic portion toward the first support portion; a second detachment preventing portion extending from an end of the second elastic portion toward the second support portion; a first leg portion extending from an end of the first detachment preventing portion toward the lower surface of the circuit board; and a second leg portion extending from an end of the second detachment preventing portion toward the lower surface of the circuit board, wherein the first leg portion has a plurality of first elastic pieces, and the second leg portion includes a plurality of second elastic pieces, wherein the first elastic piece of the first leg portion may be inclined outwardly from the first leg portion, and the second elastic piece of the second leg portion may be inclined outwardly from the second leg portion.

The head portion of the lighting device according to an embodiment has a width between the first side and the second side greater than a width between the third side and the fourth side, and includes a second head portion extending the first side and the second side of the head are inside It may include a second head portion extending inward from the first side and the second side of the head portion, respectively, and a first head portion connecting the second head portion.

A width between the third side and the fourth side of the second head portion of the lighting device according to an embodiment is greater than a width between the third side and the fourth side of the first head portion, and the first head portion may include an opening.

The first head portion of the lighting device according to the embodiment may include a groove recessed in the third side and the fourth side.

The first detachment preventing portion and the second detachment preventing portion of the lighting device according to the embodiment may extend in a direction parallel to the head portion.

In the lighting device according to an embodiment, each of a connection portion between the first support portion and the first elastic portion, a connection portion between the second support portion and the second elastic portion, a connection portion between the first elastic portion and the first detachment preventing portion, and a connection portion between the second elastic portion and the second detachment preventing portion may have a curved surface.

In the lighting device according to an embodiment, an angle between a virtual straight line passing through the first elastic portion and a virtual straight line passing through the first support portion is an acute angle, and an angle between a virtual straight line passing through the second elastic portion and the virtual straight line passing through the second support portion is an acute angle. An angle between a virtual straight line passing through the first detachment preventing portion and a virtual straight line passing through the first elastic portion is an acute angle, and an angle between a virtual straight line passing through the second detachment preventing portion and an virtual straight line passing through the second elastic portion may be an acute angle.

In the lighting device according to an embodiment, each of the first leg portion and the second leg portion may include a 1-1 leg portion and a 2-1 leg portion extending vertically from the ends of the first detachment preventing portion and the second detachment preventing portion, a 1-2 leg portion and a 2-2 leg portion extending from the 1-1 leg portion and the 2-1 leg portion, and the first elastic piece and the second elastic piece extending from the 1-1 leg portion and the 2-1 leg portion and inclined in an outward direction.

Advantageous Effects

The embodiment may provide a lighting device in which the coupling force between the bracket and the light emitting module is improved.

The Embodiment may provide a lighting device including a circuit board having improved heat dissipation capability.

BEST MODE

Figure 1:
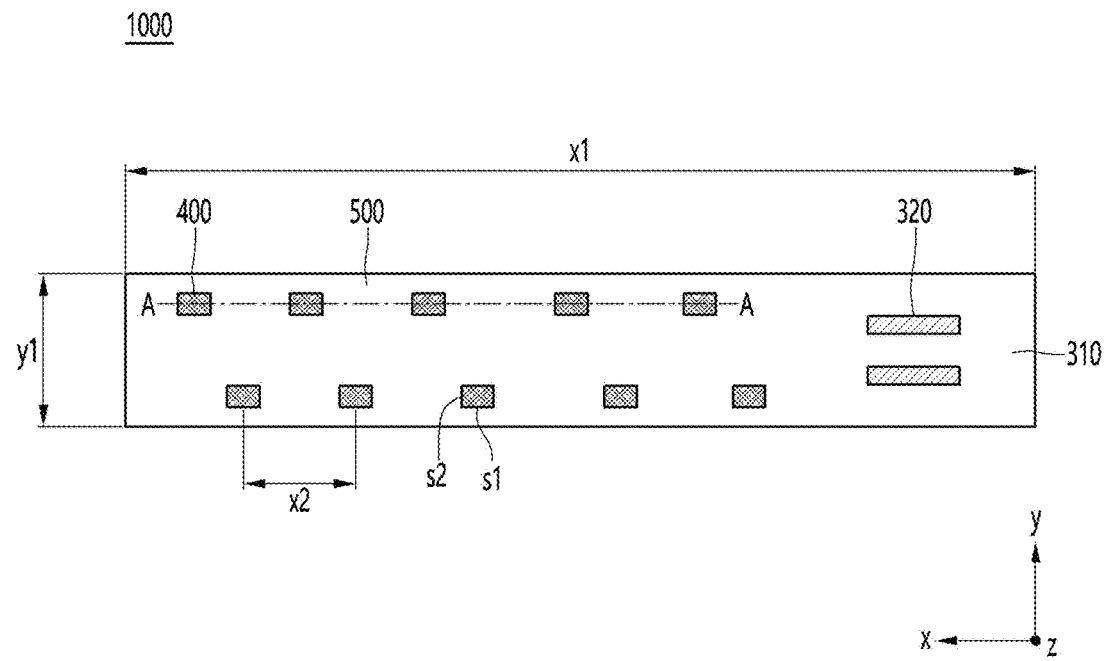
FIG. 1 is a plan view of a lighting device according to an embodiment.

Hereinafter, preferred embodiments of the invention will be described in detail with reference to the accompanying drawings.

However, a technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention.

In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component.

In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

The lighting device according to the invention may be applied to various lamp devices that require lighting, for example, a vehicle lamp, a home lighting device, or an industrial lighting device. For example, when applied to vehicle lamps, it may be applied to head lamps, sidelights, side mirror lamps, fog lamps, tail lamps, brake lamps, daytime running lamps, vehicle interior lighting, door scarves, rear combination lamps, backup lamps, etc. The lighting device of the invention may be applied to indoor and outdoor advertising devices, display devices, and various fields of electric vehicles, and may be applied to all lighting related fields or advertisement related fields which have been developed and commercialized or may be implemented in accordance with future technology development.

Figure 2:
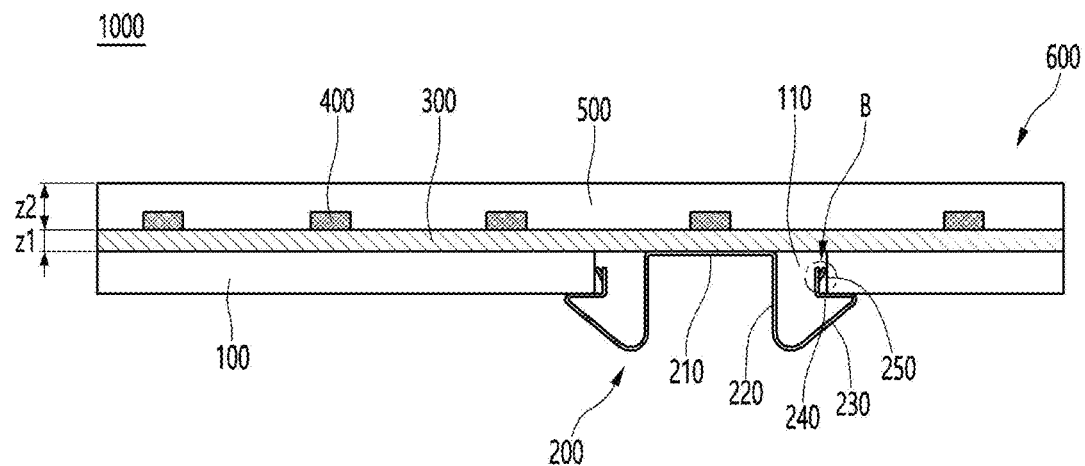
FIG. 2 is a cross-sectional view taken along line A-A' of the lighting device according to the embodiment.

FIG. 1 is a plan view of a lighting device 1000 according to an embodiment, and FIG. 2 is a cross-sectional view taken along line A-A' of a lighting device 1000 according to the embodiment.

FIGS. 1 and 2, the lighting device 1000 according to the embodiment includes a light emitting module 600 including a circuit board 300, a plurality of light emitting devices 400 disposed on the circuit board 300, a connector 320 for supplying power to the light emitting device 400, a resin layer 500 covering the light emitting device 400 and a phosphor layer (not shown) disposed on the resin layer 500; a coupling member 200 disposed under the light emitting module 600, and a bracket 100 coupled to the coupling member 200.

The lighting device 1000 may emit the light emitted from the light emitting device 400 as a surface light source. The plurality of the light emitting devices 400 may be disposed on the circuit board 300. In the lighting device 1000, the plurality of light emitting devices 400 may be arranged in N columns (N is an integer greater than or equal to 1) and/or M rows (M is an integer greater than or equal to 1). The plurality of light emitting devices 400 may be arranged in N columns and M rows (N and M are integers greater than or equal to 2) as shown in FIG. 1.

The lighting device 1000 may be applied to various lamp devices required for lighting, for example, a vehicle lamp, a home lighting device, and an industrial lighting device. For example, in the case of a lighting module applied to a vehicle lamp, it may be applied to a head lamp, a side lamp, a side mirror lamp, a fog lamp, a tail lamp, a turn signal lamp, a backup lamp, a stop lamp, daytime running right, vehicle interior lighting, door scarf, rear combination lamp, backup lamp, etc.

The circuit board 300 may function as a base member or a support member positioned under the plurality of light emitting devices 400 and the resin layer 500. The circuit board 300 may include a printed circuit board (PCB). For example, the circuit board 300 may include at least one of a resin-based printed circuit board (PCB), a metal core PCB, a flexible PCB, a ceramic PCB, or an FR-4 board.

An upper surface of the circuit board 300 may have a plane of X-axis and Y-axis, and a thickness of the circuit board 300 may be a height in the X direction and the Z direction orthogonal to the Y direction. Here, the X direction may be a first direction, the Y direction may be a second direction orthogonal to the X direction, and the Z direction may be a third direction orthogonal to the X direction and the Y direction.

The circuit board 300 may include a wiring layer (not shown) thereon, and the wiring layer may be electrically connected to the light emitting device 400. The circuit board 300 may include a reflective member or a protective layer disposed on the wiring layer, which may protect the wiring layer. The plurality of light emitting devices 400 may be connected in series, parallel, or series-parallel by a wiring layer of the circuit board 300. In the plurality of light emitting devices 400, groups having two or more may be connected in series or in parallel, or each of the groups may be connected in series or in parallel from each other.

A length x1 in the first direction (X direction) and a length y1 in the second direction (Y direction) of the circuit board 300 may be different from each other, for example, the length x1 in the first direction may be disposed longer than the length y1 in the second direction. The length x1 in the first direction may be greater than or equal to twice the length y1 in the second direction. A thickness z1 of the circuit board 300 may be 1.0 mm or less, for example, in the range of 0.5 mm to 1.0 mm. Since the thickness z1 of the circuit board 300 is provided thin, the thickness of the lighting module may not be increased. Since the circuit board 300 has the thickness z1 of 1.0 mm or less, it may support a flexible module.

The thickness (z1+z2) of the light emitting module 600 may be ⅓ or less of the shorter length among the lengths x1 and y1 in the first direction (X direction) and the second direction (Y direction) of the circuit board 300, but is not limited thereto. The thickness (z1+z2) of the light emitting module 600 may be 5.5 mm or less, in a range of 4.5 mm to 5.5 mm, or in a range of 4.5 mm to 5 mm from the bottom of the circuit board 300. The thickness (z1+z2) of the light emitting module 600 may be a linear distance (z1+z2) between the lower surface of the circuit board 300 and the upper surface of the resin layer 500. The thickness (z1+z2) of the light emitting module 600 may be 220% or less of the thickness z2 of the resin layer 500, for example, in a range of 180% to 220%. Since the light emitting module 600 has the thickness (z1+z2) of 5.5 mm or less, it may be provided as a flexible and slim surface light source module.

When the thickness (z1+z2) of the light emitting module 600 is thinner than the above range, a light diffusion space is reduced and a hot spot may be generated, and when it is greater than the above range, spatial installation restrictions and design freedom may be reduced due to an increase in module thickness. The embodiment provides a lighting device capable of a curved structure by providing a thickness (z1+z2) of the light emitting module 600 of 5.5 mm or less or 5 mm or less, thereby reducing design freedom and spatial restrictions. A ratio of the length y1 in the Y direction of the lighting device 1000 to the thickness (z1+z2) of the light emitting module 600 may be 1:m, and may have a ratio relationship of m≥1, The m is a natural number of at least 1, and the column of the light emitting device 400 may be an integer smaller than m. For example, when the m is greater than four times the thickness (z1+z2) of the lighting device 1000, the light emitting devices 400 may be arranged in four rows.

A portion of the circuit board 300 may include a connector 320 to supply power to the light emitting devices 400. In the circuit board 300, a region 310 in which the connector 320 is disposed is a region in which the resin layer 500 is not formed, and may be equal to or smaller than the length y1 in the Y direction of the circuit board 300. The connector 320 may be disposed on a portion of an upper surface or a portion of a lower surface of the circuit board 300. When the connector 320 is disposed on the lower surface of the circuit board 300, the region may be removed. The circuit board 300 may have a top view shape of a rectangle, a square, or other polygonal shapes, and may have a bar shape having a curved shape. The connector 320 may be a terminal connected to the light emitting device 400 or a female connector or a male connector.

The circuit board 300 may include a protective layer or a reflective layer thereon. The protective layer or the reflective layer may include a member having a solder resist material, and the solder resist material is a white material and may reflect incident light.

As another example, the circuit board 300 may include a transparent material. Since the circuit board 300 made of the transparent material is provided, the light emitted from the light emitting device 400 may be emitted in an upper surface direction and a lower surface direction of the circuit board 300.

The light emitting device 400 may be disposed on the circuit board 300. The light emitting device 400 has a light emitting surface S1 and a plurality of side surfaces S2, the light emitting surface S1 faces the upper surface of the resin layer 500, and may be emitted toward the resin layer 500 from the light emitting device 400. The light exit surface S1 is a top surface of the light emitting device 400, and most of the light is emitted through the top surface. The plurality of side surfaces S2 includes at least four side surfaces and emits light in a lateral direction of the light emitting device 400. The light emitting device 400 is an LED chip that emits light on at least five sides, and may be disposed on the circuit board 300 in the form of a flip chip. The light emitting device 400 may be formed to a thickness of 0.3 mm or less.

As another example, the light emitting device 400 may be implemented as a horizontal chip or a vertical chip. In the case of the horizontal type chip or the vertical type chip, it may be connected to another chip or a wiring pattern by a wire. When a wire is connected to the LED chip, the thickness of the diffusion layer may be increased due to the height of the wire, and a distance between the light emitting devices 400 may be increased due to the connection space according to the length of the wire. In the light emitting device 400 according to the embodiment, the distribution of an angle distribution may be increased by emitting light from five sides. The light emitting device 400 may be disposed on the circuit board 300 as a flip chip. The distance x2 between the light emitting devices 400 may be equal to or greater than the thickness z2 (z2≤x2) of the resin layer 500. The distance x2 between the light emitting devices 400 may be, for example, 2.5 mm or more, and may vary depending on the size of the LED chip. The minimum distance between the light emitting devices 400 may be equal to or greater than the thickness z2 of the resin layer 500.

Since the light emitting device 400 disclosed in the embodiment is provided as a flip chip that emits light on at least five sides, the luminance distribution and the beam angle distribution of the light emitting device 400 may be improved.

When the light emitting devices 400 are arranged in an N×M matrix on the circuit board 300, N may be one or more columns or two columns, and M may be one or more rows or two rows. The N and M are integers of 1 or more. The light emitting devices 400 may be respectively arranged in the Y-axis and X-axis directions.

The light emitting device 400 is a light emitting diode (LED) chip, and may emit at least one of blue, red, green, ultraviolet (UV), and infrared rays. The light emitting device 400 may emit, for example, at least one of blue, red, and green. The light emitting device 400 may be electrically connected to the circuit board 300, but is not limited thereto.

The plurality of light emitting devices 400 disposed on the circuit board 300 may be sealed by the resin layer 500. The plurality of light emitting devices 400 may be in contact with the resin layer 500. The resin layer 500 may be disposed on a side surface and an upper surface of the light emitting device 400.

Light emitted from the light emitting device 400 may be emitted through the resin layer 500. The light emitted from the light emitting device 400 may be emitted to the outside through the resin layer 500 and a phosphor layer (not shown) disposed on the resin layer 500.

The resin layer 500 may be made of a transparent resin material, for example, a resin material such as UV (ultra violet) resin, silicone, or epoxy. The resin layer 500 may be a diffusion layer or a molding layer without a diffusion agent. The UV resin may be, for example, a resin (oligomer type) having a urethane acrylate oligomer as a main material as a main material. For example, a urethane acrylate oligomer that is a synthetic oligomer may be used. The main material may further include a monomer mixed with low-boiling dilution-type reactive monomers such as IBOA (isobornyl acrylate), HBA (Hydroxybutyl Acrylate), and HEMA (Hydroxy Metaethyl Acrylate), and as an additive, a photoinitiator (e.g., 1-hydroxycyclohexyl phenyl-ketone, Diphenyl), Diphenyl (2,4,6-trimethylbenzoyl phosphine oxide), etc. or antioxidants may be mixed. The UV resin may be formed of a composition comprising 10 to 21% of an oligomer, 30 to 63% of a monomer, and 1.5 to 6% of an additive. In this case, the monomer may be composed of a mixture of 10 to 21% of IBOA (isobornyl acrylate), 10 to 21% of HBA (Hydroxybutyl Acrylate), and 10 to 21% of HEMA (Hydroxy Metaethyl Acrylate). The additive may be formed into a mixture capable of improving the yellowing phenomenon by adding 1 to 5% of a photoinitiator to perform a function of initiating photoreactivity, and adding 0.5 to 1% of an antioxidant. Formation of the resin layer 300 using the composition described above is to form a layer with a resin such as UV resin instead of a light guide plate, so that refractive index and thickness may be adjusted, and at the same time, adhesive properties, reliability, and mass production speed of the resin layer using the above-described composition may all be satisfied.

A phosphor layer (not shown) may be disposed on the resin layer 500. The phosphor layer may be disposed to cover the upper surface of the resin layer 500. The phosphor layer may include a transparent material. The phosphor layer may include a transparent insulating material. The phosphor layer may be made of a silicon material, or may be made of a silicon material having different chemical bonds. Silicone is a polymer in which inorganic silicon and organic carbon are combined, and has physical properties such as thermal stability, chemical stability, abrasion resistance, and glossiness of inorganic substances, and reactivity, solubility, elasticity, and processability, which are characteristics of organic substances. The silicon may include general silicon and fluorine silicon with an increased fluorine ratio. Increasing the fluorine ratio of fluorinated silicon has an effect of improving moisture resistance.

The phosphor layer may include a wavelength conversion means for receiving light emitted from the light emitting device 400 and providing wavelength-converted light. For example, the phosphor layer may include at least one selected from the group consisting of phosphors, quantum dots, and the like. The phosphor or quantum dots may emit blue, green, or red light.

The phosphor may be uniformly disposed in the phosphor layer. The phosphor may include a phosphor of a fluoride compound, for example, may include at least one of an MGF-based phosphor, a KSF-based phosphor, or a KTF-based phosphor.

When the phosphor is a red phosphor, the red phosphor may have a wavelength range of 610 nm to 650 nm, and the wavelength may have a width of less than 10 nm. The red phosphor may include a fluoride-based phosphor.

As shown in FIG. 2, the bracket 100 may be disposed under the circuit board 300. The bracket 100 may support the light emitting module 600. The bracket 100 may include an insertion groove 110 from which a portion of the bracket 100 is removed. The coupling member 200 disposed under the light emitting module 600 may be inserted into the insertion groove 110 of the bracket 100 so that the bracket 100 and the light emitting module 600 may be coupled. The bracket 100 may be formed of a metal or plastic material, but is not limited thereto.

Figure 3:
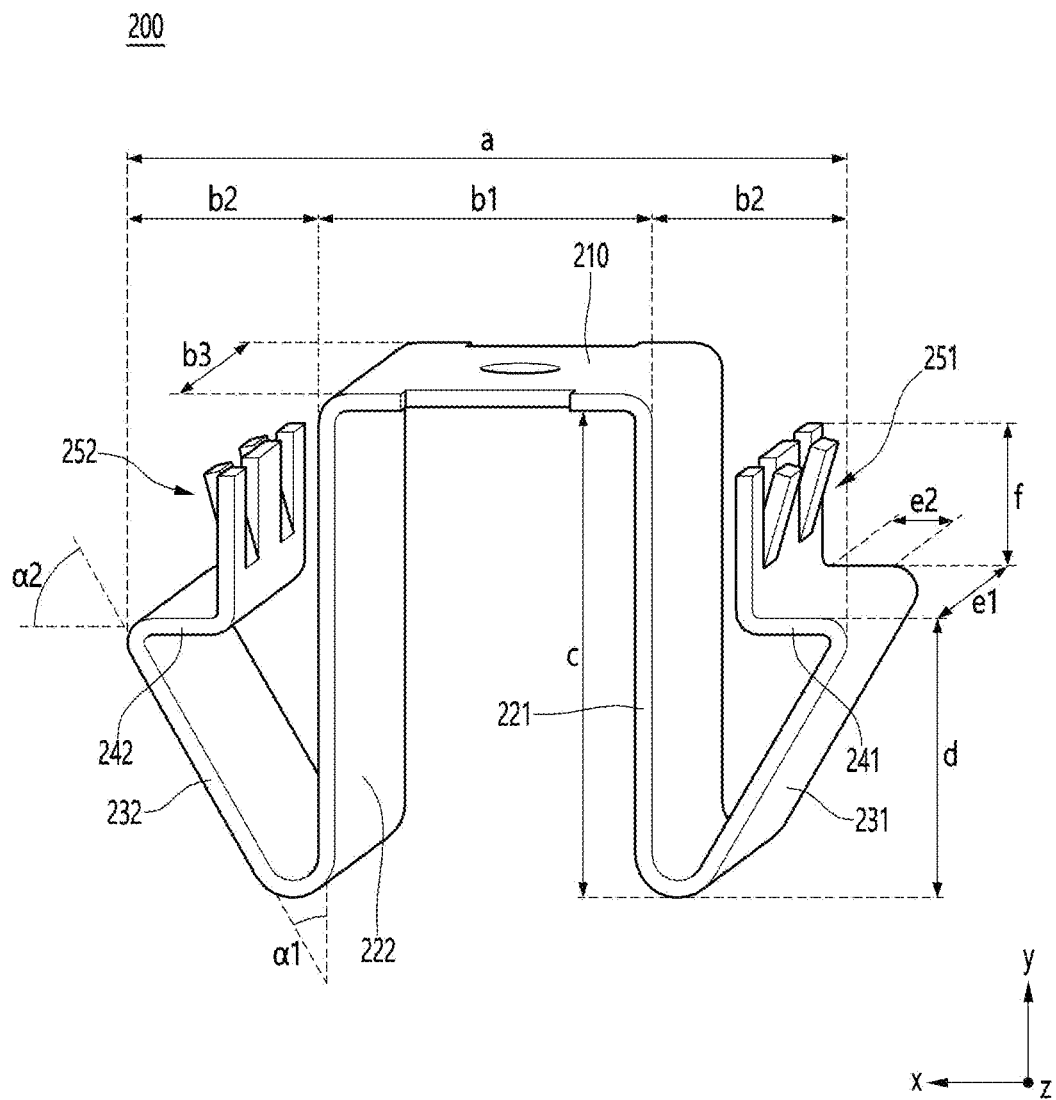
FIG. 3 is a perspective view of a coupling member according to the embodiment.

As shown in FIGS. 2 and 3, the coupling member 200 may be disposed under the circuit board 300. The coupling member 200 may contact the lower surface of the circuit board 300. For example, the coupling member 200 may be coupled to the lower surface of the circuit board 300 by an adhesive. When the coupling member 200 is in contact with the lower surface of the circuit board 300, the heat dissipation capability of the circuit board 300 may be improved.

The lower surface of the circuit board 300 may expose a metal plate that is a portion of the circuit board 300. Accordingly, the bonding member 200 and the metal plate may be bonded with an adhesive, for example, a bonding material such as solder paste, and a heat dissipation area of the circuit board 300 may be improved by the bonding.

The coupling member 200 may include a head portion 210 disposed under the circuit board 300, a support portion 220 bent at both ends of the head portion 210, an elastic portion 230 extending outwardly from the other end of the support portion 220, a detachment preventing portion 240 is bent and extended from the elastic portion 230, and a leg portion 250 that is partially extended in a vertical direction from the detachment preventing portions 240 and is partially bent with an inclined surface. The coupling member 200 is inserted into the insertion groove 110 of the bracket 100 so that the coupling member 200 and the bracket 100 are fitted to each other, so that a coupling force between the bracket 100 and the light emitting module 600 may be improved.

The thickness of the coupling member 200 may be 0.2 mm±0.05 mm. For example, when the thickness of the coupling member 200 is 0.15 mm or less, a rigidity of the coupling member 200 is lowered, the coupling force between the coupling member 200 and the bracket 100 is weakened, and when the thickness of the coupling member 200 is 0.25 mm or more, a volume of the coupling member 200 is improved, so that the coupling member 200 and the bracket 100 may not be properly coupled.

The width a in the first direction of the coupling member 200 may be 8.6 mm±1.0 mm. The widths b3 and e1 in the second direction of the coupling member 200 may be 6 mm±1.0 mm. The length c in the third direction of the coupling member 200 may be 6 mm±1.0 mm.

Figure 4:
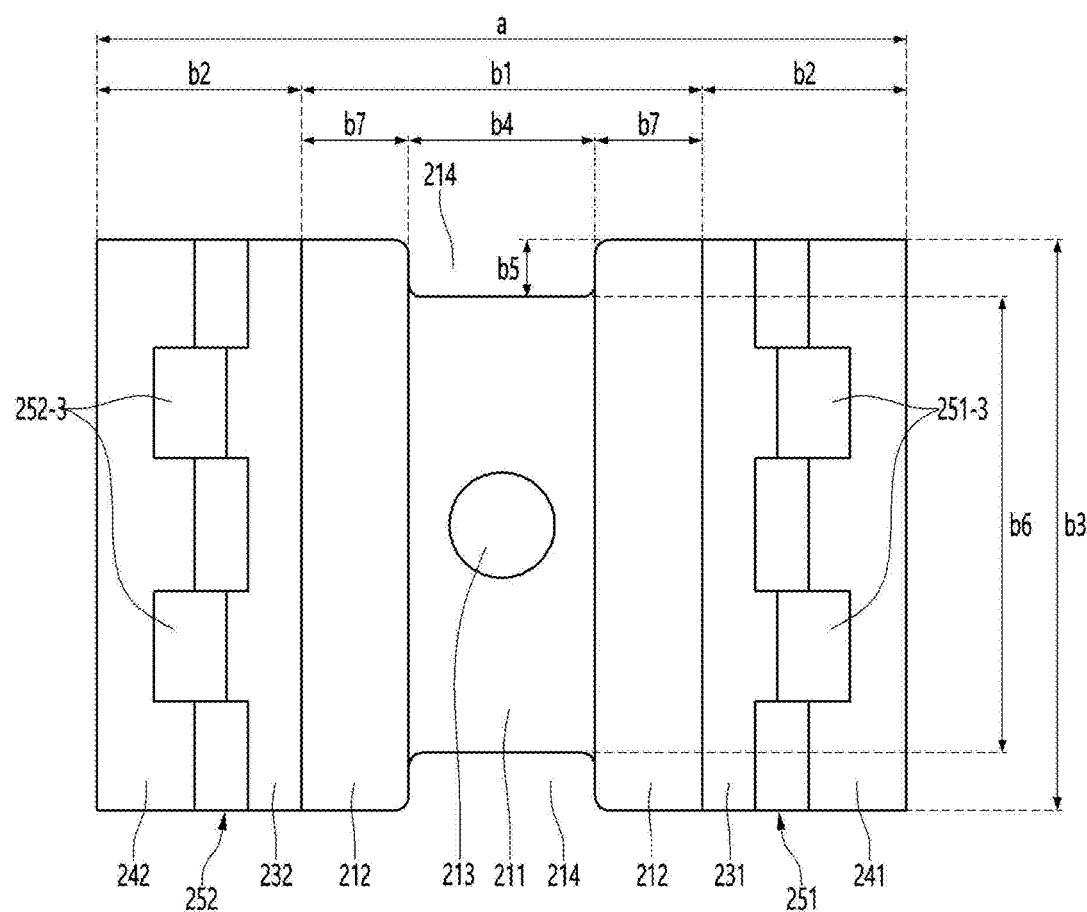
FIG. 4 is a cross-sectional view of a region B of the lighting device according to the embodiment.

As shown in FIGS. 2 to 4, the head portion 210 may be disposed under the circuit board 300. The head portion 210 may be in contact with the lower surface of the circuit board 300. The head portion 210 may be disposed under the circuit board 300 to support the circuit board 300. The head portion 210 may extend in the first direction (X direction) to contact the lower surface of the circuit board 300. The head portion 210 may include a first side, a second side opposite to the first side, a third side connected to the first side and the second side, and a fourth side opposite to the third side. The width b1 of the head portion 210 in the first direction may be the same as the width b1 between the first side and the second side. The maximum width b3 of the head portion 210 in the second direction may be the same as the maximum width b3 between the third side and the fourth side. The width b1 of the head portion 210 in the first direction may be smaller than the maximum width b3 of the head portion 210 in the second direction. A ratio of the width b1 in the first direction of the head portion 210 to the maximum width b3 in the second direction of the head portion 210 may be 2:3. The width b1 of the head portion 210 in the first direction may be smaller than the minimum width b6 of the head portion 210 in the second direction.

A ratio of the width b1 in the first direction of the head portion 210 to the minimum width b6 in the second direction of the head portion 210 may be 1:1.2. The width b1 of the head portion 210 in the first direction may be 4 mm±1.0 mm. The maximum width b3 in the second direction of the head portion 210 may be 6 mm±1.0 mm. The minimum width b6 of the head portion 210 in the second direction may be 4.8 mm±1.0 mm. The head portion 210 may include an opening 213.

Referring to FIG. 4, the head portion 210 may include grooves 214 recessed inward from both sides of the head portion 210. The groove 214 of the head portion 210 may contact the bracket 100. The coupling force between the head portion 210 and the bracket 100 may be improved by a step structure formed by the groove 214 of the head portion 210. The width b4 of the groove 214 in the first direction may be greater than the width b5 of the groove 214 in the second direction. A ratio of the width b4 of the groove 214 in the first direction to the width b5 of the groove 214 in the second direction may be 1:0.3. A width b4 of the groove 214 in the first direction may be 2 mm±1.0 mm. A width b5 of the groove 214 in the second direction may be 0.6 mm±0.3 mm.

As shown in FIGS. 3 and 4, the head portion 210 may include a first head portion 211 and a second head portion 212 extending from one end and the other end of the first head portion 211, respectively. The first head portion 211 and the second head portion 212 may be formed to have different widths in the first direction (X direction) and the second direction (Y direction), respectively.

A width b7 of the second head portion 212 in the first direction may be smaller than a width b4 of the first head portion 211 in the first direction. A ratio of the width b7 of the second head portion 212 in the first direction to the width b4 of the first head portion 211 in the first direction may be 1:2. A width b3 of the second head portion 212 in the second direction may be greater than a width b6 of the first head portion 211 in the second direction. A ratio of the width b3 in the second direction of the second head portion 212 to the width b6 in the second direction of the first head portion 211 may be 1:0.8. For example, the width b4 of the first head portion 211 in the first direction may be 2 mm±1.0 mm. For example, the width b7 of the second head portion 212 in the first direction may be 1 mm±0.5 mm. For example, the width b6 of the first head portion 211 in the second direction may be 4.8 mm±1.0 mm. For example, the width b3 of the second head portion 212 in the second direction may be 6 mm±0.5 mm.

As described above, the first head portion 211 and the second head portion 212 are formed to have different widths in the first direction and the second direction, so that the first head portion 211 and the second head portion 212 have different widths and may include the groove 214 recessed inwardly from both sides of the first head portion 211. Accordingly, the opposite side of the head portion 210 has a stepped structure to improve the coupling force between the head portion 210 and the bracket 100.

The first head portion 211 may include an opening 213. The opening 213 of the first head portion 211 may be formed in a polygonal shape, but is not limited thereto. For example, the opening 213 of the first head portion 211 may be formed in a circular shape. When the head portion 210 is adhered to the lower surface of the circuit board 300 with an adhesive, the opening 213 of the first head portion 211 may prevent an excessively coated adhesive from flowing through the opening 213 to be attached to the coupling member 200 and the circuit board 300 from being misaligned.

As shown in FIGS. 2 and 3, the support portion 220 may extend in a third direction (Z direction) that is perpendicular to the head portion 210. The support portion 220 may extend in a direction perpendicular to the direction in which the head portion 210 extends. The support portion 220 may be disposed to extend from the ends of at least two of the four sides of the head portion 210. The support portion 220 may be disposed to extend from the ends of two opposite sides of the four sides of the head portion 210.

The support portion 220 may include a first support portion 221 extending in a vertical direction from one end of the head portion 210 and a second support portion 222 extending from the other end of the head portion 210. The first support portion 221 and the second support portion 222 may be disposed to face each other. The first support portion 221 and the second support portion 222 may be disposed parallel to each other. The first support portion 221 and the second support portion 222 may be disposed to extend in a direction parallel to each other.

The support portion 220 may include the first support portion 221 extending from one end of the second head portion 212 and the second support portion 222 extending from the other end of the second head portion 212. The length c in the third direction of the first support portion 221 and the second support portion 222 may be the same, but is not limited thereto. The length c in the third direction of the first support portion 221 and the second support portion 222 may be greater than the depth of the insertion groove 110.

The length c in the third direction of the first support portion 221 and the second support portion 222 may be longer than the length b1 of the head portion 210 in the first direction. A ratio of the length c in the third direction of the first support portion 221 and the second support portion 222 to the length b1 in the first direction of the head portion 210 may be 3:2. For example, the length c in the third direction of the first support portion 221 and the second support portion 222 may be 6 mm±1.0 mm.

The elastic portion 230 may be bent and extended in the support portion 220. The elastic portion 230 may include an inclined surface extending from the support portion 220. The elastic portion 230 may be bent at an acute angle α1 from the support portion 220. For example, the elastic portion 230 may be bent at an angle of 30 degrees±10 degrees from the support portion 220. For example, the angle α1 between the inclined surface of the elastic portion 230 and the support portion 220 may be 30 degrees. The connection portion between the elastic portion 230 and the support portion 220 may be formed in a curved surface, but is not limited thereto.

The elastic portion 230 may include a first elastic portion 231 extended from the first support portion 221 and bent, and a second elastic portion 232 extended from the second support portion 222 and bent. The first elastic portion 231 and the second elastic portion 232 may be bent and extended in opposite directions from the support portion 220. The first elastic portion 231 and the second elastic portion 232 may include inclined surfaces extending in opposite directions to each other. The first elastic portion 231 and the second elastic portion 232 have elasticity, and the inclined surface in the outward direction of the support portion 220 is inserted into the insertion groove 110 to fix the circuit board 300 and the coupling member 200.

The first elastic portion 231 may be bent and extended from the first support portion 221. The first elastic portion 231 may be disposed to extend from the first support portion 221 with an inclined surface. The first elastic portion 231 may be bent outwardly of the first support portion 221. The inclined surface of the first elastic portion 231 may be disposed to correspond to the first support portion 221. An angle α1 between the first elastic portion 231 and the first support portion 221 may be an acute angle. For example, the angle α1 between the first elastic portion 231 and the first support portion 221 may be 30 degrees±10 degrees.

The second elastic portion 232 may be bent and extended from the second support portion 222. The second elastic portion 232 may be disposed to extend from the second support portion 222 with an inclined surface. The second elastic portion 232 may be bent outwardly of the second support portion 222. The inclined surface of the second elastic portion 232 may be disposed to correspond to the second support portion 222. The first elastic portion 231 and the second elastic portion 232 may be bent and extended in opposite directions, respectively. An angle α1 between the second elastic portion 232 and the second support portion 222 may be an acute angle. For example, the angle α1 between the second elastic portion 232 and the second support portion 222 may be 30 degrees±10 degrees.

A length b2 of the first elastic portion 231 and the second elastic portion 232 in the first direction may be 2.3 mm±1.0 mm. A height d in the third direction of the first elastic portion 231 and the second elastic portion 232 may be 3.3 mm±1.0.

The detachment preventing portion 240 may be bent and extended from the elastic portion 230. The detachment preventing portion 240 may be disposed to extend in a direction parallel to the head portion 210. The detachment preventing portion 240 may be disposed to be spaced apart from the support portion 220 by a predetermined distance. The detachment preventing portion 240 may be disposed to extend in a direction perpendicular to the extending direction of the support portion 220. The detachment preventing portion 240 may extend from an end of the elastic portion 230 toward the support portion 220. The detachment preventing portion 240 may be in contact with the bracket 100. The upper surface of the detachment preventing portion 240 may be in contact with the lower surface of the bracket 100. The connecting portion between the detachment preventing portion 240 and the elastic portion 230 may be formed in a curved surface, but is not limited thereto. The detachment preventing portion 240 may contact the lower surface of the circuit board 240 to couple the insertion groove 110 and the coupling member 200.

The detachment preventing portion 240 may include a first detachment preventing portion 241 bent and extended from the first elastic portion 231, and a second detachment preventing portion 242 bent and extended from the second elastic portion 232. The detachment preventing portion 240 may include a first detachment preventing portion 241 and the second detachment preventing portion 242 extending from one end of the first elastic portion 231 and the second elastic portion 232 toward the first support portion 221 and the second support portion 222, respectively. The first detachment preventing portion 241 and the second detachment preventing portion 242 may be disposed on the same plane. The first detachment preventing portion 241 and the second detachment preventing portion 242 may contact a stepped structure of the insertion groove 110. Since the first detachment preventing portion 241 and the second detachment preventing portion 242 may be caught on a jaw of the stepped structure of the bracket 100 in which the insertion groove 110 is formed, the circuit board 300 and the bracket 100 coupled with the coupling member 200 may be coupled.

The first detachment preventing portion 241 and the second detachment preventing portion 242 may be bent at an acute angle α2 from the first elastic portion 231 and the second elastic portion 232, respectively. For example, the first detachment preventing portion 241 and the second detachment preventing portion 242 may be bent to an angle α2 of 60±10 degrees from the first elastic portion 231 and the second elastic portion 232.

The width e2 in the first direction of the first detachment preventing portion 241 and the second detachment preventing portion 242 may be smaller than the width e1 in the second direction of the first detachment preventing portion 241 and the second detachment preventing portion 242. A ratio of the width e2 in the first direction of the first detachment preventing portion 241 to the width e1 in the second direction of the first detachment preventing portion 241 and the second detachment preventing portion 242 may be 1:6.

A width e2 in the first direction of the first detachment preventing portion 241 and the second detachment preventing portion 242 may be 1 mm±0.5 mm. The width e1 in the second direction of the first detachment preventing portion 241 and the second detachment preventing portion 242 may be 6 mm±1.0 mm. The shortest distance between the first detachment preventing portion 241 and the first support portion 221 may be 1 mm. The shortest distance between the second detachment preventing portion 242 and the second support portion 222 may be 1 mm.

As shown in FIGS. 3 to 6, the leg portion 250 may extend from the detachment preventing portion 240. The leg portion 250 may extend from an end of the detachment preventing portion 240 toward a lower surface of the circuit board 300. The leg portion 250 may be disposed in the insertion groove 110. The leg portion 250 may include a first leg portion 251 extending from the first detachment preventing portion 241 in the direction of the lower surface of the circuit board 300 and a second leg portion 252 extending from the second detachment preventing portion 242 in the direction of the lower surface of the circuit board 300. The leg portion 250 may be inserted into the insertion groove 110 to couple the circuit board 300 and the coupling member 200. A portion of the leg portion 250 may come into contact with the inner surface of the bracket 100 forming the insertion groove 110 to improve the coupling force between the coupling member 200 and the circuit board 300.

Figure 5A:
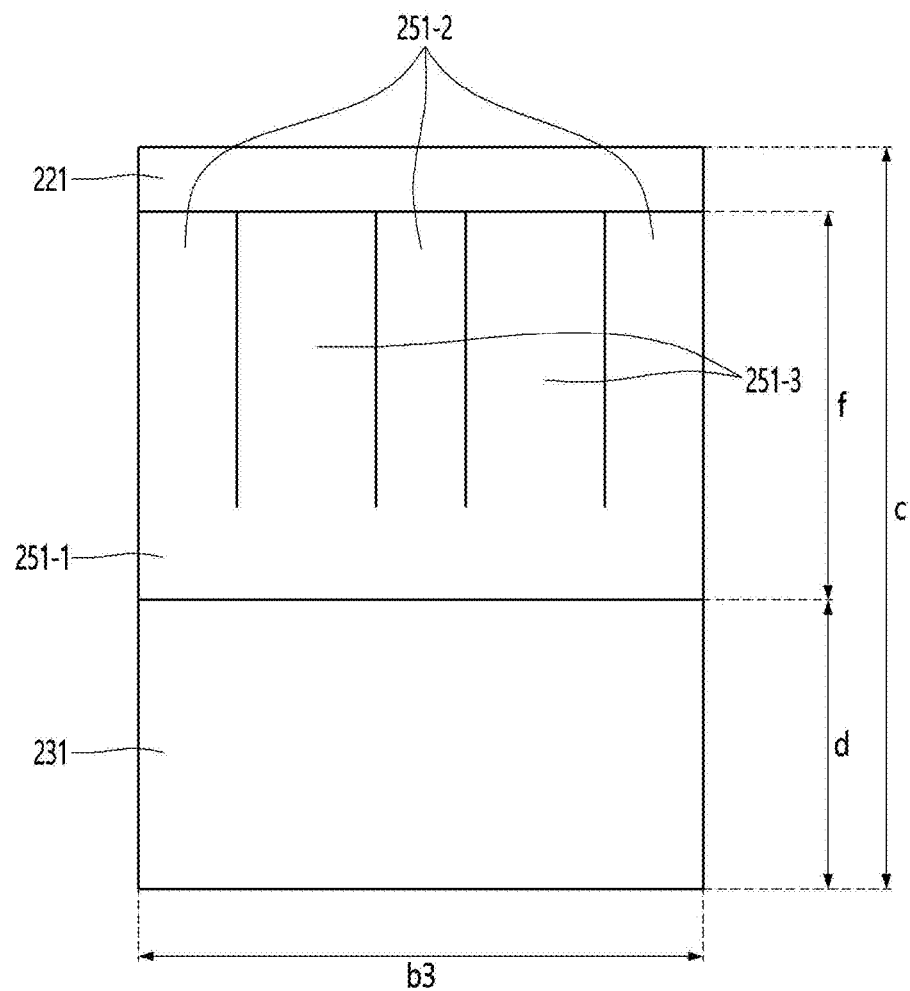
FIGS. 5a and 5b are a plan view of a coupling member according to the embodiment.

Referring to FIG. 5a, the first leg portion 251 may extend a predetermined distance in a vertical direction from the first detachment preventing portion 241. The first leg portion 251 may include a 1-1 leg portion 251-1 extending in a direction perpendicular to a predetermined distance from the first detachment preventing portion 241. The leg portion 250 may include a 1-2 leg portion 251-2 extending from the 1-1 leg portion 251-1, and a first elastic piece 251-3 extending a different angle from the 1-1 leg portion 251-1 and the 1-2 leg portion and including an inclined surface. The first elastic piece 251-3 may be bent at a predetermined angle from the 1-1 leg portion 251-1 to extend. The first elastic piece 251-3 may be inclined outwardly from the 1-1 leg portion 251-1.

The 1-2 leg portion 251-2 may be disposed to extend in a direction perpendicular to the first detachment preventing portion 241. The 1-1 leg portion 251-1 and the 1-2 leg portion 251-2 may be disposed to extend in a direction parallel to the first support portion 221 and the second support portion 222. The 1-1 leg portion 251-1 and the 1-2 leg portion 251-2 may be disposed to correspond to the first support portion 221. The 1-1 leg portion 251-1 and the 1-2 leg portion 251-2 may be disposed to face the first support portion 221. The 1-1 leg portion 251-1, the 1-2 leg portion 251-2, and the first elastic piece 251-3 are disposed in the insertion groove 110 of the bracket 100.

The first elastic piece 251-3 may be bent and extended from the 1-1 leg portion 251-1 and may have an inclined surface. The inclined surface of the first elastic piece 251-3 may be disposed to extend from the 1-1 leg portion 251-1 at an angle different from that of the 1-1 leg portion 251-1. The angle α3 between the inclined surface of the first elastic piece 251-3 and the 1-1 leg portion 251-1 and the 1-2 leg portion 251-2 may be 15±5.

The inclined surface of the first elastic piece 251-3 may be in contact with the inner surface of the bracket 100 forming the insertion groove 110. When the coupling member 200 is inserted into the insertion groove 110, a portion of the inclined surface of the first elastic piece 251-3 may be overlapped with the inner surface of the bracket 100 forming the insertion groove 110 in the vertical direction. For example, the inclined surface of the first elastic piece 251-3 and the inner surface of the insertion groove 110 may overlap in the first direction or the inclined surface of the first elastic piece 251-3 and the insertion groove 110 may overlap in the vertical direction by 0.1 mm. In addition, the coupling member 200 may be formed of a material having elasticity, so that a part of the inclined surface of the first elastic portion 251-3 which is overlap the inner surface of the bracket forming the insertion groove 110 may be pushed out and disposed in the insertion groove 110. Accordingly, the friction coefficient between the inner surface of the bracket 100 forming the insertion groove 110 and the first elastic piece 251-3 increases, so that the bracket 100 and the coupling member 200 bonding strength can be improved.

The length e1 of the first leg portion 251 in the second direction may be 6 mm±1.0 mm. A length f in the third direction from the 1-1 leg portion 251-1 to the 1-2 leg portion 251-2 may be 1.7 mm±0.5 mm. The lengths of the 1-2 leg portions 251-2 and the first elastic piece 251-3 in the third direction may be the same, but are not limited thereto. The length of the 1-2 leg portion 251-2 and the first elastic piece 251-3 in the second direction may be different from each other. For example, the width in the second direction of the first elastic piece 251-3 may be greater than the width in the second direction of the 1-2 leg portion 251-2, but is not limited thereto. When the width in the second direction of the first elastic piece 251-3 is greater than the width in the second direction of the 1-2 leg portion 251-2, the first elastic piece 251-3, an area in contact with the inner surface of the bracket 100 forming the insertion groove 110 may be increased, so that the coupling force between the coupling member 200 and the bracket 100 may be improved.

Figure 5B:
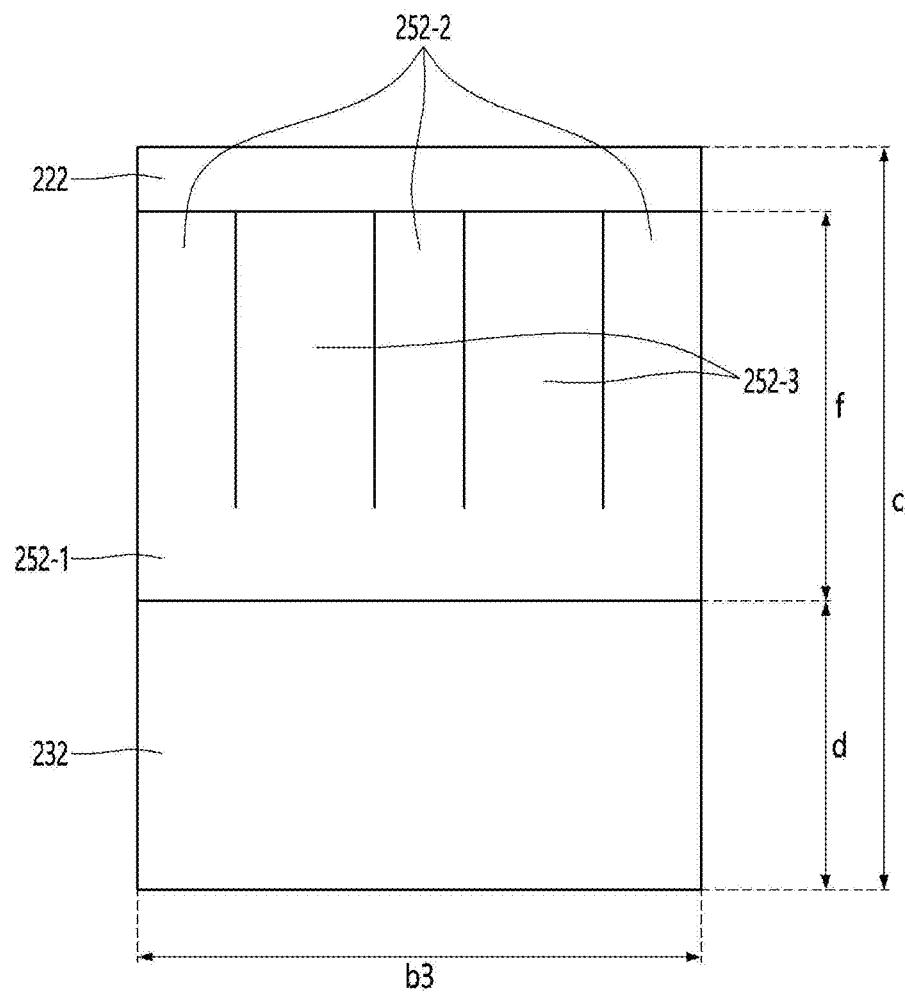
Figure 6:
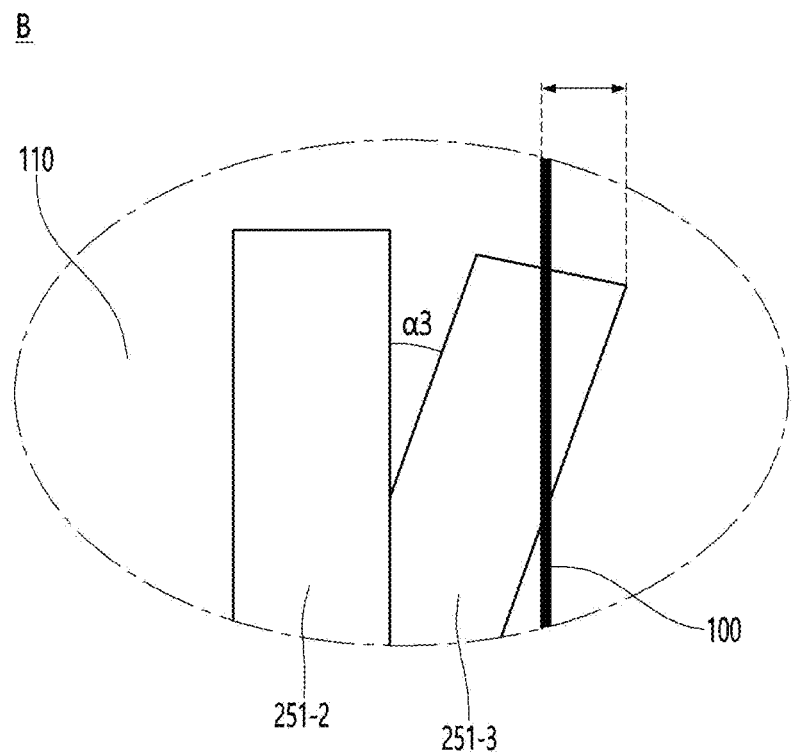
FIG. 6 is a right-side view of the coupling member according to the embodiment.

Referring to FIG. 5b, the second leg portion 252 may extend a predetermined distance in a vertical direction from the second detachment preventing portion 242. The second leg portion 252 may include a 2-1 leg portion 252-1 extending in a direction perpendicular to a predetermined distance from the second detachment preventing portion 242. The leg portion 250 may include a 2-2 leg portion 252-2 extending from the 2-1 leg portion 252-1, and a second elastic piece 252-3 extending at different angle from the 2-2 leg portion 252-2 and the 2-1 leg portion 252-1 and including an inclined surface. The second elastic piece 252-3 may be bent at a predetermined angle from the 2-1 leg portion 252-1 to extend. The second elastic piece 252-3 may be inclined outwardly from the 2-1 leg portion 251-1.

The 2-2 leg portion 252-2 may be disposed to extend in a direction perpendicular to the second detachment preventing portion 242. The 2-1 leg portion 252-1 and the 2-2 leg portion 252-2 may be disposed to extend in a direction parallel to the first support portion 221 and the second support portion 222. The 2-1 leg portion 252-1 and the 2-2 leg portion 252-2 may be disposed to correspond to the second support portion 222. The 2-1 leg portion 252-1 and the 2-2 leg portion 252-2 may be disposed to face the second support portion 222. The 2-1 leg portion 252-1, the 2-2 leg portion 252-2 and the second elastic piece 252-3 may be disposed in the insertion groove 110 of the bracket 100.

The second elastic piece 252-3 may be bent and extended from the 2-1 leg portion 252-1 and may have an inclined surface. The inclined surface of the second elastic piece 252-3 may be disposed to extend from the 2-1 leg portion 252-1 and may have a different angle from the 2-1 leg portion 252-1. For example, the angle α3 between the inclined surface of the second elastic piece 252-3 and the 2-1 leg portion 252-1 and the 2-2 leg portion 252-2. may be 15±5 degrees.

The inclined surface of the second elastic piece 252-3 may be in contact with the inner surface of the bracket 100 forming the insertion groove 110 of the bracket 100. When the coupling member 200 is inserted into the insertion groove 110, a portion of the inclined surface of the second elastic piece 252-3 may be overlapped with the inner surface of the bracket 100 forming the insertion groove 110 in the vertical direction. For example, the inclined surface of the second elastic piece 252-3 and the inner surface of the bracket 100 forming the insertion groove 110 may overlap by 0.1 mm in the vertical direction. In addition, the coupling member 200 is formed of a material having elasticity, and the inclined surface of the second elastic part 252-3 which is overlapped with the inner surface of the bracket 100 forming the insertion groove 110 may be pushed out and disposed in the insertion groove 110. Accordingly, the friction coefficient between the inner surface of the bracket 100 forming the insertion groove 110 and the second elastic piece 252-3 increases, so that coupling force of the bracket 100 and the coupling member 200 may be improved.

A length f in the third direction from the 2-1 leg portion 251-1 to the 2-2 leg portion 252-2 may be 1.7 mm±0.5 mm. The length e1 of the second leg portion 252 in the second direction may be 6.0 mm±1.0 mm. The lengths of the 2-2 leg portion 252-2 and the second elastic piece 252-3 in the third direction may be the same. The lengths of the 2-2 leg portion 252-2 and the second elastic piece 252-3 in the second direction may be different from each other. For example, the width of the second elastic piece 252-3 in the second direction may be greater than the width of the second 2-2 leg portion 252-2 in the second direction, but is not limited thereto. When the width in the second direction of the second elastic piece 252-3 is greater than the width in the second direction of the 2-2 leg portion 252-2, the second elastic piece 252-3, an area in contact with the inner surface of the bracket 100 forming the insertion groove 110 may be increased, so that the coupling force between the coupling member 200 and the bracket 100 may be improved.

As described above, in the lighting device according to the embodiment, the coupling member 200 disposed under the circuit board 300 is inserted into the insertion groove 110 of the bracket 100, and the coupling member 200 may include a head portion 210 bonded to the lower surface of the circuit board 300, a support portion 220 extending in a vertical direction from the head portion 210, an elastic portion 230 bent at a predetermined angle from the support portion 220, a detachment preventing portion 240 extending from the elastic portion 230 in a direction perpendicular to the support portion 220, and an a leg portion 250 that is extending from the detachment preventing portion 240 and including a portion of the leg portion 250 bent at a predetermined angle from the detachment preventing portion 240. Accordingly, the leg portion 250 of the coupling member 200 comes into contact with the inner surface of the bracket 100 forming the insertion groove 110, so that the coupling member 200 and the insertion groove 110 are in contact with each other. As the friction coefficient with the inner surface increases, the coupling force between the bracket 100 and the light emitting module 600 may be improved. In addition, since the coupling member 200 is adhered to the lower surface of the circuit board 300, the heat generated by the light emitting device 400 is emitted to the coupling member 200 to increase the heat dissipation capability of the light emitting module 600. It is possible to improve the reliability of the lighting device.

Figure 7A:
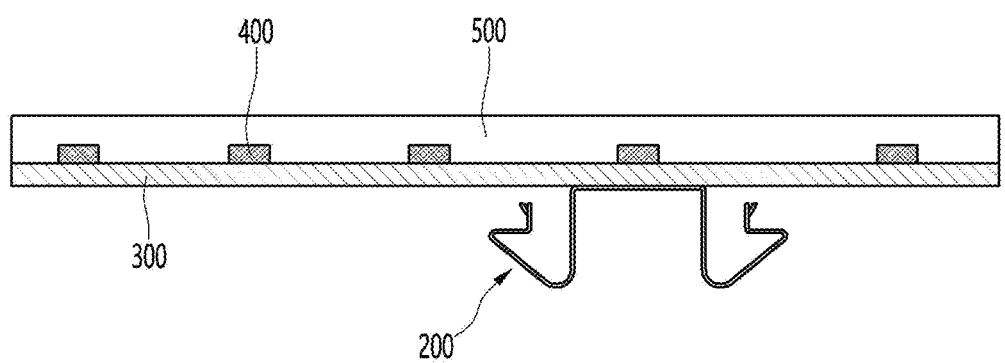
FIGS. 7a to 7c are cross-sectional views illustrating a coupling process of a lighting device according to an embodiment.
Figure 7B:
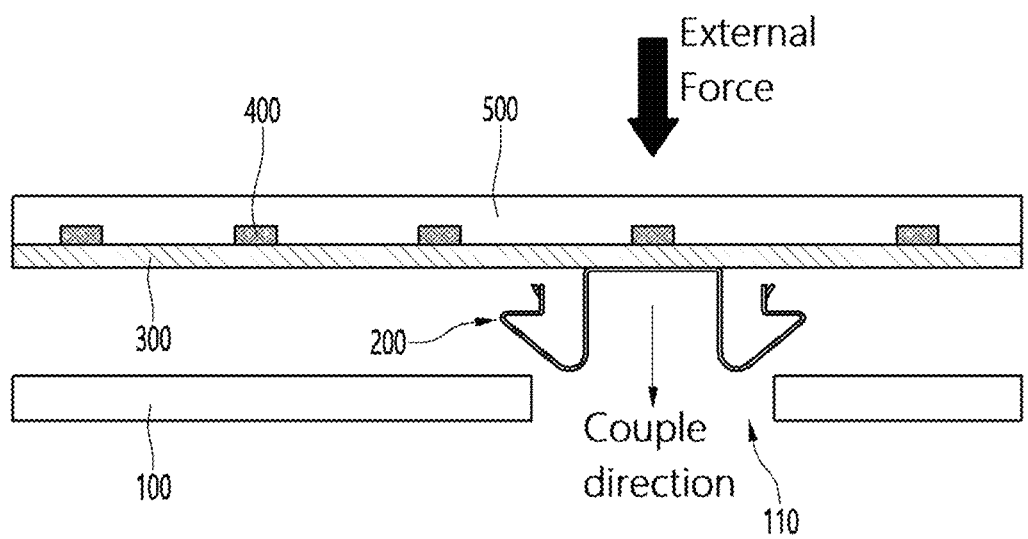
Figure 7C:
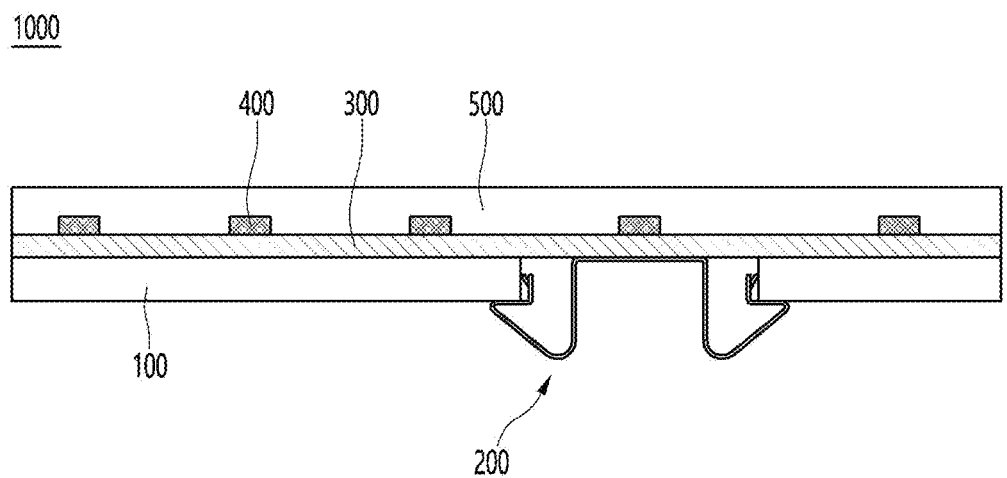

FIGS. 7a to 7c are views illustrating a process in which the coupling member 200 disposed in contact with the lower surface of the circuit board 300 is coupled to the insertion groove 110 of the bracket 100. As shown in FIG. 7a, after the coupling member 200 is adhered to the lower surface of the circuit board 300 using an adhesive (not shown), as shown in FIG. 7b, the coupling member 200 is inserted into the insertion groove 110 of the bracket 100 by an external force so that the coupling member 200 and the bracket 100 may be fitted. And, as shown in FIG. 7c, a portion of the inclined surface of the leg portion 250 comes into contact with the inner surface of the bracket 100 forming the insertion groove 110, and the coupling force increases as the friction coefficient increases. When a part of the inclined surface of the leg portion 250 comes into contact with the inner surface of the bracket 100 forming the insertion groove 110, the coupling force is improved as the friction coefficient increases, and when the detachment preventing portion 240 in contact with the lower surface of the bracket 100, the coupling member 200 may be prevented from being tilted from the bracket 100. In addition, since the coupling member 200 is formed on the lower surface of the circuit board 300, the heat dissipation capability of the circuit board 300 may be improved.

As described above, in the lighting device according to the embodiment, a coupling member 200 disposed on the lower surface of the circuit board 300 and the bracket 100 are coupled to each other between the bracket 100 and the light emitting module 600. The coupling force may be improved. Therefore, in the lighting device according to the embodiment, the coupling member 200 may be inserted into the insertion groove 110 of the bracket 100 to couple the coupling member 200 and the light emitting module 600 to a simple process. Since the light emitting module 600 and the bracket 100 may be combined by this, the process cost may be reduced. Then, portions 251-3 and 252-3 of the leg portion 250 of the coupling member 200 is in contact with the inner surface of the bracket 100 forming the insertion groove 110, so that the light emitting module 600 may be fixed to the bracket 100, so that the coupling force between the light emitting module 600 and the bracket 100 may be improved.

Figure 8A:
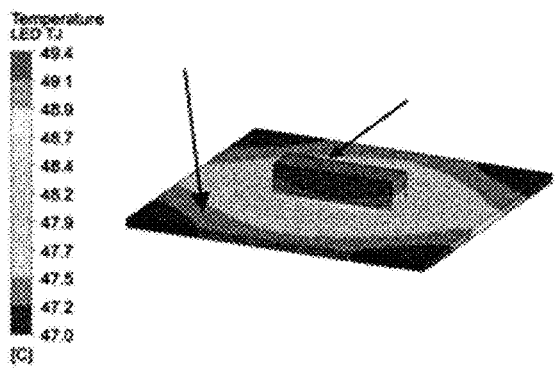
FIGS. 8a and 8b are views showing a comparison of heat dissipation capabilities according to comparative example and the embodiment.
Figure 8A:
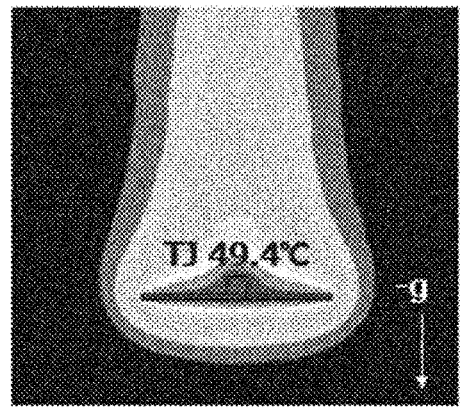
Figure 8B:
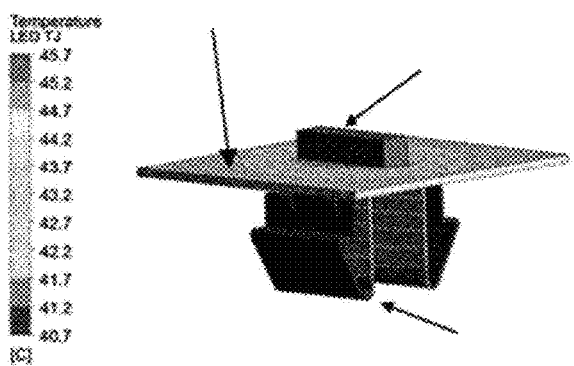
Figure 8B:
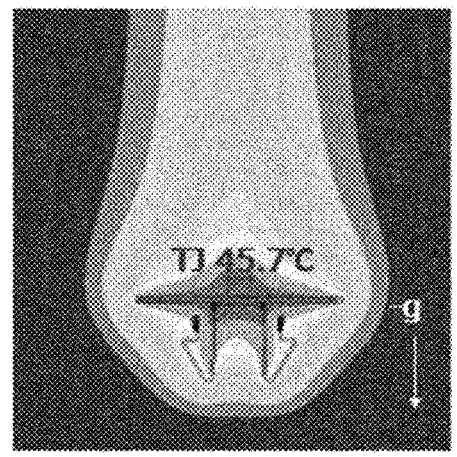

FIG. 8a is a view showing the heat dissipation capability of the circuit board 300 when the light emitting device 400 is disposed on the circuit board 300 and the coupling member 200 is not disposed under the circuit board 300, FIG. 8b is a view showing the heat dissipation capability of the circuit board 300 when the light emitting device 400 is disposed on the circuit board 300 and the coupling member 200 is adhered under the circuit board 300. Comparing FIGS. 8a and 8b, as shown in FIG. 8a, when the coupling member 200 is not disposed under the circuit board 300, the heat generated by the light emitting device 400 is generated from the circuit board 300, a temperature of the light emitting device 400 is measured at 49.4 degrees, and as shown in FIG. 8b, when the coupling member 200 is disposed under the circuit board 300, a heat generated by the light emitting device 400 was emitted to the circuit board 300 and the coupling member 200, so that the temperature of the light emitting device 400 was measured to be 45.7 degrees. Accordingly, when the coupling member 200 is disposed under the circuit board 300, the heat dissipation capability of the circuit board 300 is improved, thereby improving the reliability of the lighting device.

Figure 9:
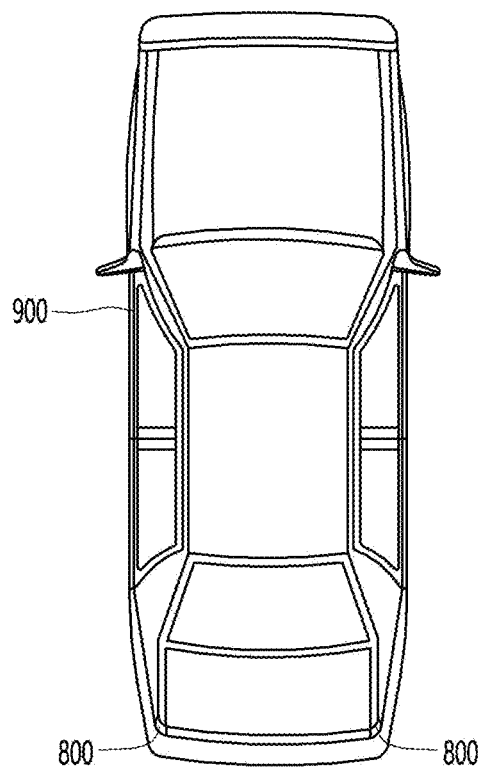
FIG. 9 is a plan view of a vehicle to which a lamp including a lighting device according to an embodiment is applied.
Figure 9:
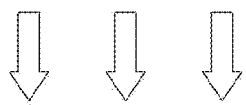
Figure 10:
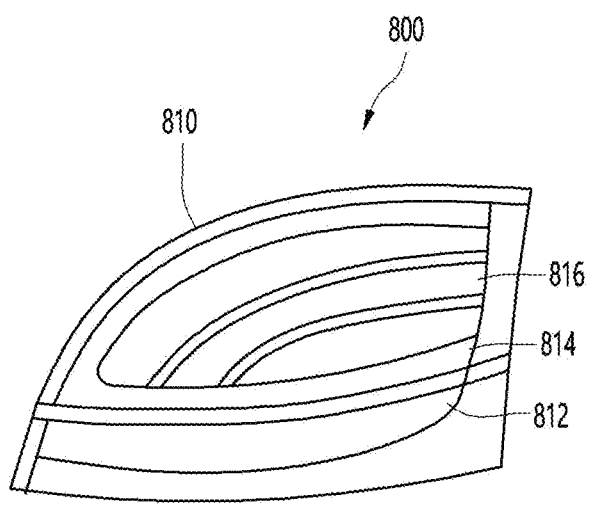
FIG. 10 is a diagram illustrating a lamp having a lighting device according to an embodiment.

FIG. 9 is a plan view of a vehicle to which a vehicle lamp to which a lighting device is applied according to an embodiment is applied, and FIG. 10 is a view showing a vehicle lamp having a lighting device disclosed in the embodiment.

As shown in FIGS. 9 and 10, a tail light 800 in the vehicle 900 may include a first lamp unit 812, a second lamp unit 814, a third lamp unit 816, and a housing 810. Here, the first lamp unit 812 may be a light source serving as a turn indicator, the second lamp unit 814 may be a light source serving as a sidelight, and the third lamp unit 816 may be a light source serve as a brake light, but is not limited thereto. At least one or all of the first to third lamp units 812, 814, and 816 may include the lighting module disclosed in the embodiment. The housing 810 accommodates the first to third lamp units 812, 814, and 816, and may be made of a light-transmitting material. In this case, the housing 810 may have a curve according to the design of the vehicle body, and the first to third lamp units 812, 814, and 816 may implement a surface light source that may have a curved surface according to the shape of the housing 810. Such a vehicle lamp may be applied to a turn signal lamp of a vehicle when the lamp unit is applied to a tail lamp, a brake lamp, or a turn signal lamp of a vehicle.

Features, structures, effects, etc. described in the above embodiments are included in at least one embodiment of the invention, and are not necessarily limited to only one embodiment. Furthermore, features, structures, effects, etc. illustrated in each embodiment may be combined or modified for other embodiments by those of ordinary skill in the art to which the embodiments belong. Accordingly, the contents related to such combinations and modifications should be interpreted as being included in the scope of the invention.

In addition, although the embodiment has been described above, it is only an example and does not limit the invention, and those of ordinary skill in the art to which the invention pertains are exemplified above in a range that does not depart from the essential characteristics of the present embodiment. It may be seen that various modifications and applications that have not been made are possible. For example, each component specifically shown in the embodiment may be implemented by modification. And the differences related to these modifications and applications should be construed as being included in the scope of the invention defined in the appended claims.

The invention claimed is:

1. A lighting device comprising:
a light emitting module including a circuit board and a plurality of light emitting devices disposed on the circuit board;
a coupling member coupled to a lower surface of the circuit board,
wherein the coupling member includes:
a head portion disposed on the lower surface of the circuit board and including a first side, a second side opposite to the first side, a third side connected to the first side and the second side, and a fourth side opposite to the third side;
a first support portion extending in a vertical direction from one end of the head portion;
a second support portion extending in a vertical direction from the other end of the head portion;
a first elastic portion bent from the first support portion in an outward direction of the first support portion;
a second elastic portion bent from the second support portion in an outward direction of the second support portion;
a first detachment preventing portion extending from an end of the first elastic portion in a direction of the first support portion;
a second detachment preventing portion extending from an end of the second elastic portion toward the second support portion;
a first leg portion extending from an end of the first detachment preventing portion toward a lower surface of the circuit board; and
a second leg portion extending from an end of the second detachment preventing portion toward a lower surface of the circuit board,
wherein the first leg portion has a plurality of first elastic pieces,
wherein the second leg portion has a plurality of second elastic pieces,
wherein the first elastic piece of the first leg portion is inclined outwardly from the first leg portion, and
wherein the second elastic piece of the second leg portion is inclined outwardly from the second leg portion.

2. The lighting device of claim 1,
wherein the head portion has a width between the first side and the second side greater than a width between the third side and the fourth side, and
wherein the head portion includes a second head portion extending inward from the first side and the second side of the head portion, respectively, and a first head portion connecting the second head portion.

3. The lighting device of claim 2,
wherein a width between the third side and the fourth side of the second head portion is greater than a width between the third side and the fourth side of the first head portion;
wherein the first head portion comprises an opening.

4. The lighting device of claim 2,
wherein the first head portion includes grooves recessed from the third side and the fourth side.

5. The lighting device of claim 2,
wherein the first detachment preventing portion and the second detachment preventing portion extend in a direction parallel to the head portion.

6. The lighting device of claim 1,
wherein each of a connection portion between the first support portion and the first elastic portion, a connection portion between the second support portion and the second elastic portion, a connection portion between the first elastic portion and the first detachment preventing portion, and a connection portion between the second elastic portion and the second detachment preventing portion is a curved surface.

7. The lighting device of claim 2,
wherein an angle between a virtual straight line passing through both ends of the first elastic portion and a virtual straight line passing through both ends of the first support portion is an acute angle,
wherein an angle between a virtual straight line passing through both ends of the second elastic portion and a virtual straight line passing through both ends of the second support portion is an acute angle,
wherein an angle between a virtual straight line passing through both ends of the first detachment preventing portion and a virtual straight line passing through both ends of the first elastic unit is an acute angle,
wherein an angle between a virtual straight line passing through both ends of the second detachment preventing portion and a virtual straight line passing through both ends of the second elastic portion is an acute angle.

8. The lighting device of claim 1,
wherein each of the first leg portion and the second leg portion includes a 1-1 leg portion and a 2-1 leg portion extending vertically from the ends of the first detachment preventing portion and the second detachment preventing portion, a 1-2 leg portion and a 2-2 leg portion extending from the 1-1 leg portion and the 2-1 leg portion, and the first elastic piece and the second elastic piece extending from the 1-1 leg portion and the 2-1 leg portion and inclined in an outward direction.

9. The lighting device of claim 1,
wherein the coupling member is coupled to the lower surface of the circuit board with an adhesive.

10. The lighting device of claim 9, further comprising
a resin layer disposed on the circuit board,
wherein the resin layer seals the plurality of light emitting devices,
wherein the plurality of light emitting devices include an LED.

11. A lighting device comprising:
a light emitting module comprising a circuit board, a plurality of light emitting devices disposed on a first surface of the circuit board, and a resin layer sealing the plurality of light emitting devices;
a coupling member coupled to a second surface of the circuit board;
wherein the coupling member includes:
a head portion disposed on the second surface of the circuit board;
a first support portion bent downward from one end of the head portion;
a second support portion bent downward from the other end of the head portion and facing the first support portion;
a first elastic portion extending obliquely in an outward direction of the first support portion from a lower end of the first support portion;
a second elastic portion extending obliquely in an outward direction of the second support portion from a lower end of the second support portion;
a first leg portion connected to the first elastic portion and extending toward a lower surface of the circuit board; and
a second leg portion connected to the second elastic portion and extending toward the lower surface of the circuit board,
wherein the first leg portion and the second leg portion include at least one elastic piece inclined outward,
wherein the first leg portion, the second leg portion, and the elastic piece are spaced apart from the lower surface of the circuit board.

12. The lighting device of claim 11, further comprising:
a first detachment preventing portion bent from an end of the first elastic portion toward the first support portion and connected to the first leg portion; and
a second detachment preventing portion bent from an end of the second elastic portion toward the second support portion and connected to the second leg portion.

13. The lighting device of claim 11,
wherein the first leg portion includes a first elastic piece inclined outward from a lower portion of the first leg portion, and
wherein the second leg portion includes a second elastic piece inclined outward from a lower portion of the second leg portion.

14. The lighting device of claim 13,
wherein the first elastic piece is branched from different regions of the first leg portion, and
wherein the second elastic piece is branched from different regions of the second leg portion.

15. The lighting device of claim 13,
wherein an outer end of the first elastic piece is disposed more inward than an end of the first elastic portion, and
wherein an outer end of the second elastic piece is disposed more inward than an end of the second elastic portion.

16. The lighting device of claim 13,
wherein the first elastic piece is further spaced apart from the first leg portion closer to the lower surface of the circuit board, and
wherein the second elastic piece is further spaced from the second leg portion closer to the lower surface of the circuit board.

17. The lighting device of claim 11,
wherein a thickness of the head portion, the first and second elastic portions, and the elastic piece is a same.

18. The lighting device of claim 12,
wherein a virtual straight line passing through the first detachment preventing portion and the second detachment preventing portion is arranged parallel to a straight line passing through both ends of the head portion,
wherein a bent portion between the first support portion and the first elastic portion is a curved surface,
wherein a bent portion between the second support portion and the second elastic portion is a curved surface.

19. The lighting device of claim 12,
wherein an angle between a virtual straight line passing through both ends of the first elastic portion and a virtual straight line passing through both ends of the first support portion is an acute angle,
wherein an angle between a virtual straight line passing through both ends of the second elastic portion and virtual straight line passing through both ends of the second support portion is an acute angle,
wherein an angle between a virtual straight line passing through both ends of the first detachment preventing portion and a virtual straight line passing through both ends of the first elastic portion is an acute angle,
wherein an angle between a virtual straight line passing through both ends of the second detachment preventing portion and a virtual straight line passing through both ends of the second elastic portion is an acute angle.

20. The lighting device of claim 12, further comprising:
a bracket through which the coupling member passes through a lower portion of the circuit board;
wherein the bracket is disposed between the first and second detachment preventing portions and the circuit board, and is in contact with the elastic piece.

* * * * *